US010585217B2

(12) United States Patent
Yim et al.

(10) Patent No.: US 10,585,217 B2
(45) Date of Patent: *Mar. 10, 2020

(54) MIRROR SUBSTRATES, METHODS OF MANUFACTURING THE SAME AND DISPLAY DEVICES INCLUDING THE SAME

(71) Applicant: Samsung Display Co., Ltd., Yongin-Si, Gyeonggi-Do (KR)

(72) Inventors: Sang-Hoon Yim, Suwon-si (KR); Dong-Chan Kim, Gunpo-si (KR); Won-Jong Kim, Suwon-si (KR); Eung-Do Kim, Seoul (KR); Dong-Kyu Seo, Hwaseong-si (KR); Ji-Hye Lee, Incheon (KR); Da-Hea Im, Incheon (KR); Yoon-Hyeung Cho, Yongin-si (KR); Won-Suk Han, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/164,625

(22) Filed: Oct. 18, 2018

(65) Prior Publication Data

US 2019/0049633 A1 Feb. 14, 2019

Related U.S. Application Data

(63) Continuation of application No. 15/397,606, filed on Jan. 3, 2017, now Pat. No. 10,132,968.

(30) Foreign Application Priority Data

Jan. 19, 2016 (KR) .......................... 10-2016-0006385

(51) Int. Cl.
*H01L 51/52* (2006.01)
*G02B 5/08* (2006.01)
(Continued)

(52) U.S. Cl.
CPC ................ *G02B 5/085* (2013.01); *B32B 7/04* (2013.01); *B32B 9/04* (2013.01); *B32B 9/045* (2013.01);
(Continued)

(58) Field of Classification Search
CPC ........... H01L 21/02697; H01L 31/0216; H01L 31/02327; H01L 33/10; H01L 33/46;
(Continued)

(56) References Cited

U.S. PATENT DOCUMENTS 10,132,968 B2 * 11/2018 Yim .......................... B32B 7/04
2005/0162591 A1 7/2005 Hashimoto
(Continued)

FOREIGN PATENT DOCUMENTS

KR 10-2014-0146952 A 12/2014

*Primary Examiner* — Stephen W Smoot
(74) *Attorney, Agent, or Firm* — Innovation Counsel LLP

(57) ABSTRACT

A mirror substrate includes a transparent substrate, a plurality of first mirror patterns arranged on the transparent substrate and spaced apart from each other, each of the first mirror patterns including a phase compensation layer and a first mirror layer sequentially stacked on the transparent substrate, and a second mirror layer disposed on the transparent substrate and between neighboring ones of the first mirror patterns, the second mirror layer having a second thickness less than a first thickness of the first mirror layer.

20 Claims, 10 Drawing Sheets

(51) Int. Cl.
    *H01L 33/60*     (2010.01)
    *H01L 51/00*     (2006.01)
    *H01L 33/46*     (2010.01)
    *H01L 21/02*     (2006.01)
    *H01L 33/10*     (2010.01)
    *B32B 7/04*     (2019.01)
    *B32B 9/04*     (2006.01)
    *B32B 17/00*     (2006.01)
    *B32B 27/06*     (2006.01)
    *H01L 31/0232*     (2014.01)

(52) U.S. Cl.
    CPC .............. *B32B 17/00* (2013.01); *B32B 27/06* (2013.01); *H01L 21/02697* (2013.01); *H01L 31/02327* (2013.01); *H01L 33/10* (2013.01); *H01L 33/46* (2013.01); *H01L 33/60* (2013.01); *H01L 51/0023* (2013.01); *H01L 51/5271* (2013.01); *B32B 2250/44* (2013.01); *B32B 2255/10* (2013.01); *B32B 2255/20* (2013.01); *B32B 2255/205* (2013.01); *B32B 2255/26* (2013.01); *B32B 2255/28* (2013.01); *B32B 2307/202* (2013.01); *B32B 2307/206* (2013.01); *B32B 2307/416* (2013.01); *B32B 2307/418* (2013.01); *B32B 2307/75* (2013.01); *B32B 2457/20* (2013.01)

(58) Field of Classification Search
    CPC . H01L 33/60; H01L 51/0023; H01L 51/5271; G02B 5/085; G02B 5/0858; G02B 5/0875; G02F 1/133553
    See application file for complete search history.

(56) References Cited

U.S. PATENT DOCUMENTS

| | | |
|---|---|---|
| 2014/0339513 A1 | 11/2014 | Yim et al. |
| 2015/0034918 A1 | 2/2015 | Yim et al. |
| 2015/0041777 A1 | 2/2015 | Chung et al. |
| 2015/0372185 A1 | 12/2015 | Rossi |
| 2016/0291219 A1 | 10/2016 | Lee et al. |
| 2016/0301027 A1 | 10/2016 | Wang et al. |
| 2017/0192300 A1 | 7/2017 | Chung et al. |

\* cited by examiner

MIRROR SUBSTRATES, METHODS OF MANUFACTURING THE SAME AND DISPLAY DEVICES INCLUDING THE SAME

CROSS-REFERENCE TO RELATED APPLICATION

This application is a continuation application of U.S. patent application Ser. No. 15/397,606 filed Jan. 3, 2017, now issued a U.S. Pat. No. 10,132,968, which claims priority under 35 USC § 119 to Korean Patent Application No. 10-2016-0006385 filed on Jan. 19, 2016 in the Korean Intellectual Property Office (KIPO), the disclosure of which is incorporated by reference in its entirety.

BACKGROUND

1. Field

The present disclosure relates to mirror substrates, methods of manufacturing the same and display devices including the same. More particularly, the present disclosure relates to mirror substrates having a plurality of mirror patterns, methods of manufacturing the same and display devices including the same.

2. Description of the Related Art

Various display devices such as an organic light emitting display (OLED) device and a liquid crystal display (LCD) device having a mirror property together with an image display property have been widely researched and developed. For example, layer structures or patterns (e.g., mirror patterns) having a reflective property may be inserted to the display device to realize the mirror property. However, an optical property or a display quality of the display device may be affected adversely due to an inclusion of the mirror patterns.

SUMMARY

Example embodiments provide a mirror substrate having an improved optical property, a method of manufacturing the mirror substrate, and a display device including the mirror substrate.

According to some example embodiments, there is provided a mirror substrate that may include a transparent substrate, a plurality of first mirror patterns arranged on the transparent substrate and spaced apart from each other, each of the first mirror patterns including a phase compensation layer and a first mirror layer sequentially stacked on the transparent substrate, and a second mirror layer disposed on the transparent substrate and between neighboring ones of the first mirror patterns, the second mirror layer having a second thickness less than a first thickness of the first mirror layer.

In some example embodiments, the phase compensation layer may include a transparent metal oxide.

In some example embodiments, the phase compensation layer may include indium tin oxide (ITO), indium zinc oxide (IZO), zinc oxide and/or indium oxide.

In some example embodiments, the mirror substrate may further include a color control layer interposed between the second mirror layer and the transparent substrate.

In some example embodiments, the color control layer may include silicon oxide.

In some example embodiments, the first mirror layer may include aluminum (Al), and the second mirror layer may include silver (Ag).

In some example embodiments, a thickness of the phase compensation layer may be greater than a thickness of the color control layer, and the first mirror layer may be farther from a surface of the transparent substrate than the second mirror layer.

In some example embodiments, the first mirror layer and the second mirror layer may commonly include Ag.

In some example embodiments, wherein a thickness of the phase compensation layer may be less than a thickness of the color control layer, and the second mirror layer may farther from a surface of the transparent substrate than the first mirror layer.

In some example embodiments, the color control layer may extend continuously along surfaces of the first mirror patterns and the transparent substrate.

In some example embodiments, the second mirror layer may extend continuously along surfaces of the first mirror patterns and the transparent substrate, and a second mirror pattern may include a portion of the second mirror layer formed between the neighboring ones of the first mirror patterns.

In some example embodiments, the mirror substrate may further include a barrier layer including a transparent conductive material. The barrier layer may be disposed on the second mirror layer.

According to some example embodiments a method for manufacturing a mirror substrate includes: determining a first thickness and a first material of a first mirror layer and a second thickness and a second material of a second mirror layer. A phase difference of reflected lights from the first mirror layer and the second mirror layer may be measured. A thickness of a phase compensation layer may be determined based on the measured phase difference. First mirror patterns may be formed on a transparent substrate. Each first mirror pattern may include the phase compensation layer having the determined thickness and the first mirror layer made of the first material having the first thickness. The second mirror layer made of the second material having the second thickness may be formed on the transparent substrate and between neighboring ones of the first mirror patterns.

In some example embodiments, the first thickness of the first mirror layer may be greater than the second thickness of the second mirror layer.

In some example embodiments, a thickness of a color control layer between the second mirror layer and the transparent substrate may be determined. The thickness of the phase compensation layer may be determined in consideration of a change of the phase difference due to the color control layer.

In some example embodiments, before forming the second mirror layer, the color control layer may be formed on the transparent substrate and between the neighboring ones of the first mirror patterns. A second mirror pattern may include the color control layer and the second mirror layer.

According to some example embodiments, there is provided a display device that may include a display substrate, a display unit on the display substrate, and a mirror substrate facing the display substrate with respect to the display unit. The mirror substrate may include a transparent substrate, a plurality of first mirror patterns arranged on the transparent substrate and spaced apart from each other, each of the first mirror patterns including a phase compensation layer and a first mirror layer sequentially stacked on the transparent substrate, and a second mirror layer disposed on the transparent substrate and between neighboring ones of the first mirror patterns, the second mirror layer having a second thickness less than a first thickness of the first mirror layer.

In some example embodiments, the display unit may include an emitting region including a pixel electrode and an emitting layer, and a non-emitting region. The non-emitting region may overlap the first mirror patterns, and the emitting region may overlap the second mirror layer.

In some example embodiments, the mirror substrate may further include a color control layer interposed between the transparent substrate and the second mirror layer.

In some example embodiments, the first mirror layer may include aluminum (Al) or silver (Ag), the second mirror layer may include Ag, the color control layer may include silicon oxide, and the phase compensation layer may include a transparent metal oxide.

BRIEF DESCRIPTION OF THE DRAWINGS

Example embodiments are more clearly understood from the following detailed description taken in conjunction with the accompanying drawings.

FIG. 1 is a cross-sectional view illustrating a mirror substrate in accordance with example embodiments;

FIG. 2 is a cross-sectional view illustrating a mirror substrate in accordance with some example embodiments;

FIGS. 3 and 4 are cross-sectional views illustrating mirror substrates in accordance with some example embodiments;

FIG. 5 is a cross-sectional view illustrating a mirror substrate in accordance with example embodiments;

FIG. 6 is a cross-sectional view illustrating a mirror substrate in accordance with some example embodiments;

FIG. 7 is a cross-sectional view illustrating a mirror substrate in accordance with some example embodiments;

FIG. 8 is a flow chart illustrating a method of manufacturing a mirror substrate in accordance with example embodiments;

FIGS. 9 to 11 are cross-sectional views illustrating a method of manufacturing a mirror substrate in accordance with example embodiments;

FIG. 12 is a flow chart illustrating a method of manufacturing a mirror substrate in accordance with example embodiments;

FIGS. 13 and 14 are cross-sectional views illustrating a method of manufacturing a mirror substrate in accordance with example embodiments;

FIG. 15 is a schematic cross-sectional view illustrating a display device in accordance with example embodiments; and FIGS. 16 to 18 are enlarged cross-sectional views of a portion designated as "A" of FIG. 15.

DETAILED DESCRIPTION OF THE EMBODIMENTS

Figure 1:
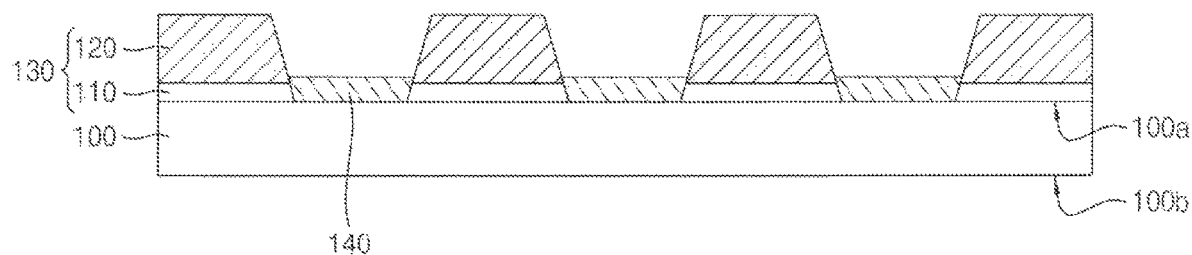
FIGS. 1 to 18 represent non-limiting example embodiments as described herein.

Various example embodiments are described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that the present disclosure is thorough and complete, and fully conveys the scope of the present inventive concept to those skilled in the art. In the drawings, the sizes and relative sizes of layers and regions may be exaggerated for clarity. Like numerals refer to like elements throughout.

It is understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It is understood that when an element is referred to as being "connected" or "coupled" to another element, it can be directly connected or coupled to the other element or one or more intervening elements may be present. In contrast, when an element is referred to as being "directly connected" or "directly coupled" to another element, there may be no intervening elements present. Other terms used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an," and "the" are intended to include the plural forms as well, unless the context clearly indicates otherwise. It is further understood that the terms "comprises" and/or "comprising," when used in the specification, specify the presence of stated features, integers, steps, operations, elements, and/or components, but may not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It is further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a cross-sectional view illustrating a mirror substrate in accordance with example embodiments. The mirror substrate may include a transparent substrate 100 and mirror layers. The transparent substrate 100 may be provided as an encapsulation substrate of a display device. The transparent substrate 100 may include a glass substrate or a transparent plastic substrate.

The transparent substrate 100 may include a first surface 100a and a second surface 100b. The mirror layers may be disposed on the first surface 100a. A viewer of the display device may be toward the second surface 100b.

The mirror layer may include a first mirror layer 120 and a second mirror layer 140. A plurality of the first mirror layers 120 and the second mirror layers 140 may be arranged alternately and repeatedly along a horizontal direction on the first surface 100a of the transparent substrate 100.

A phase compensation layer 110 may be interposed between the first mirror layer 120 and the first surface 100a of the substrate 100. For example, the phase compensation layer 110 may contact the first surface 100a and a bottom surface of the first mirror layer 120.

In some example embodiments, a first mirror pattern 130 may include the first mirror layer 120 and the phase compensation layer 110. A second mirror pattern may include the second mirror layer 140. The first mirror pattern 130 and the second mirror pattern may be arranged alternately and repeatedly on the first surface 100a.

In some example embodiments, the first mirror layer 120 and the second mirror layer 140 may include different metals. Further, a thickness of the first mirror layer 120 may be greater than that of the second mirror layer 140.

In some embodiments, a metal included in the first mirror layer 120 (a first metal) may have a refractive index in a visible light wavelength range that is greater than that of a metal included in the second mirror layer 140 (a second metal). In some embodiments, a metal cheaper than the second metal may be selected as the first metal from an economic aspect, because the first mirror layer 120 may be thicker than the second mirror layer 140. In some example embodiments, the first mirror layer 120 may include aluminum (Al), and the second mirror layer 140 may include silver (Ag).

If the mirror substrate is applied to the display device, the second mirror pattern including the second mirror layer 140 may face an emitting region of the display device. The first mirror pattern 130 may face a non-emitting region of the display device, and a reflective property or a mirror property may be realized by the first mirror pattern 130.

The phase compensation layer 110 may be interposed between the first mirror layer 120 and the transparent substrate 100, and a phase difference between reflected lights from the first mirror layer 120 and the second mirror layer 140 may be compensated. As described above, the first mirror layer 120 and the second mirror layer 140 may include different metals and/or different thicknesses to cause the phase difference of the reflected lights. Accordingly, the reflective property of the mirror substrate and a display quality of the display device including the mirror substrate may be degraded due to an interference of the reflected lights.

In some embodiments, if the first metal includes Al, and the second metal includes Ag, the first mirror layer 120 and the second mirror layer 140 may have different penetration depths of light. For example, the penetration depth of the first mirror layer 120 may be less than that of the second mirror layer 140. In this case, an incident light to the transparent substrate 100 may be reflected at a position relatively adjacent to a surface of the first mirror layer 120 including Al, and may be reflected at a position relatively adjacent to an inside of the second mirror layer 140 including Ag. Thus, the phase difference of the reflected lights may be caused by the differences of the reflected positions and/or the reflected depths.

In some example embodiments, a thickness of the phase compensation layer 110 may be determined in consideration of an extent of the phase difference. For example, a phase of the reflected light from the first mirror pattern 130 may be matched or coordinated with a phase of the reflected light from the second mirror pattern or the second mirror layer 140.

In some example embodiments, the phase compensation layer 110 may be transmissive, and may include a material that may be patterned together with the first mirror layer 120. In some embodiments, the phase compensation layer 110 may include a transparent metal oxide or a transparent conductive material, for example, indium tin oxide (ITO), indium zinc oxide (IZO), zinc oxide or indium oxide, or the like.

As described above, the phase compensation layer 110 may be included in the first mirror pattern 130. The phase compensation layer 110 is used to correct the phase difference from the reflected light by the second mirror layer 140. Therefore, the mirror substrate and the display device having improved reflective property and display quality may be achieved.

Figure 2:
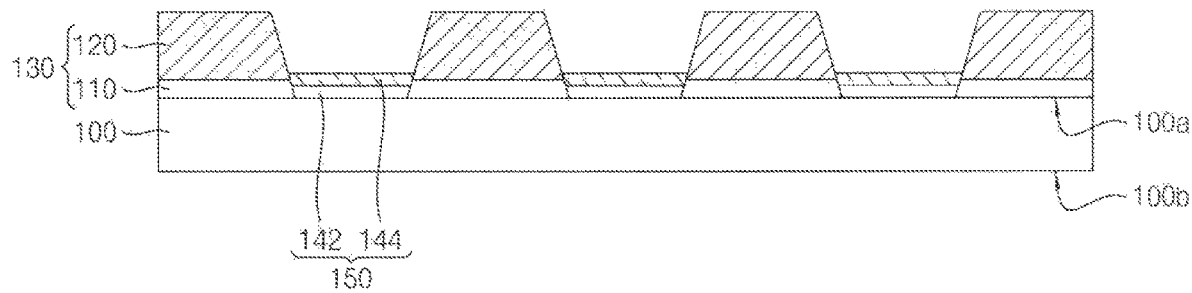

FIG. 2 is a cross-sectional view illustrating a mirror substrate in accordance with some example embodiments. The mirror substrate illustrated in FIG. 2 may have elements and/or constructions substantially the same as or similar to those illustrated in FIG. 1 except for a structure of a second mirror pattern. Thus, detailed descriptions on repeated elements and/or structure may be omitted.

Referring to FIG. 2, a second mirror pattern 150 may include a color control layer 142 and a second mirror layer 144 sequentially stacked on the first surface 100a of the transparent substrate 100. As described above, if the second mirror pattern 150 of the mirror substrate faces an emitting region of a display device, light emitting from the display device may penetrate through the second mirror pattern 150 to be visualized to the viewer. The color control layer 142 may be interposed between the second mirror layer 144 and the transparent substrate 100 to control a color impression of the display light. In some embodiments, the color control layer 142 may include an inorganic oxide-based material, for example, silicon oxide, silicon oxynitride, or the like.

As described with reference to FIG. 1, the first mirror layer 120 may include Al, and the second mirror layer 144 may include Ag. A phase difference between reflected lights from the first mirror pattern 130 and second mirror pattern 150 may become greater than that the phase difference in the mirror substrate FIG. 1 due to an inclusion of the color control layer 142 in the second mirror pattern 150.

In some embodiments, a thickness of the phase compensation layer 110 included in the first mirror pattern 130 may become greater than that included in the mirror substrate of FIG. 1. In some embodiments, the phase compensation layer 110 may be thicker than the color control layer 142. A bottom surface of the first mirror layer 120 may be higher than a bottom surface of the second mirror layer 144 from the first surface 100a of the transparent substrate 100. In this case, the second mirror layer 144 may be nearer to a viewer than the first mirror layer 120.

Figure 3:
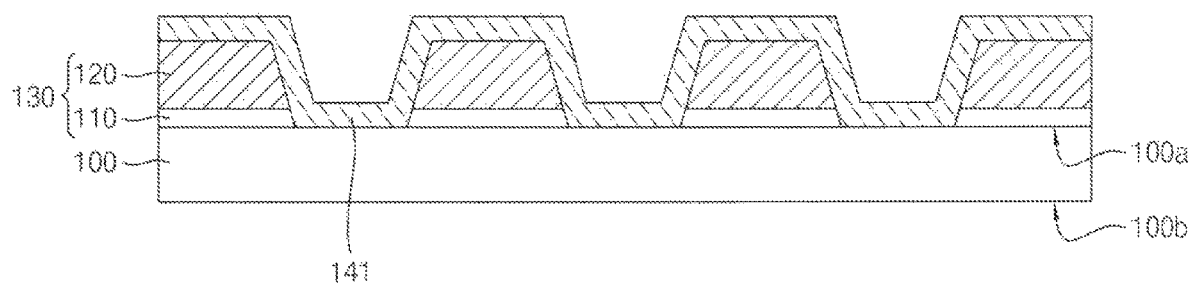
Figure 4:
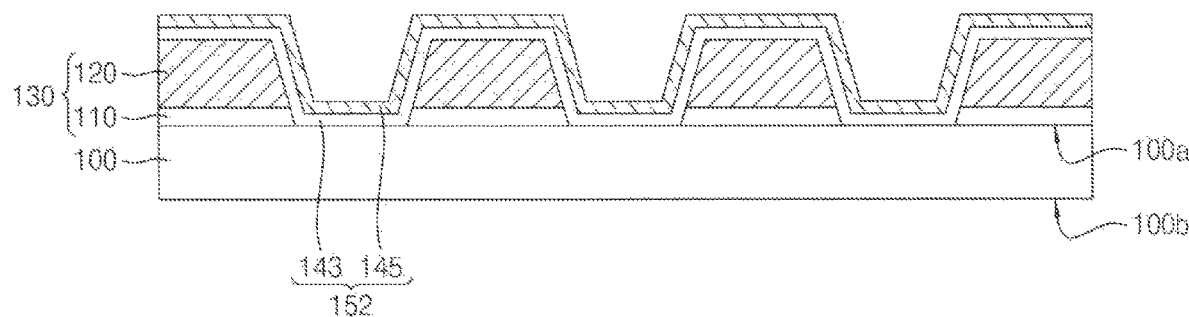

FIGS. 3 and 4 are cross-sectional views illustrating mirror substrates in accordance with some example embodiments. For example, FIG. 3 and FIG. 4 illustrate modifications of second mirror patterns illustrated in FIG. 1 and FIG. 2, respectively.

Referring to FIG. 3, a second mirror layer 141 may extend continuously and conformally along surfaces of the first mirror patterns 130 and the first surface 100a of the transparent substrate 100. In some example embodiments, a portion of the second mirror layer 141 formed between the neighboring first mirror patterns 130 and contacting the first surface 100a of the transparent substrate 100 may substantially serve as a second mirror pattern. In some embodiments, a portion of the second mirror layer 141 contacting the first mirror pattern 130 may also serve as the first mirror pattern 130 together with the first mirror layer 120.

Referring to FIG. 4, a color control layer 143 and a second mirror layer 145 may extend continuously and conformally along surfaces of the first mirror patterns 130 and the first surface 100a of the transparent substrate 100. In some example embodiments, portions of the color control layer 143 and the second mirror layer 145 formed between the neighboring first mirror patterns 130 may substantially serve as a second mirror pattern 152. In some embodiments, portions of the color control layer 143 and the second mirror layer 145 disposed on the first mirror pattern 130 may also serve as the first mirror pattern 130 together with the first mirror layer 120.

Figure 5:
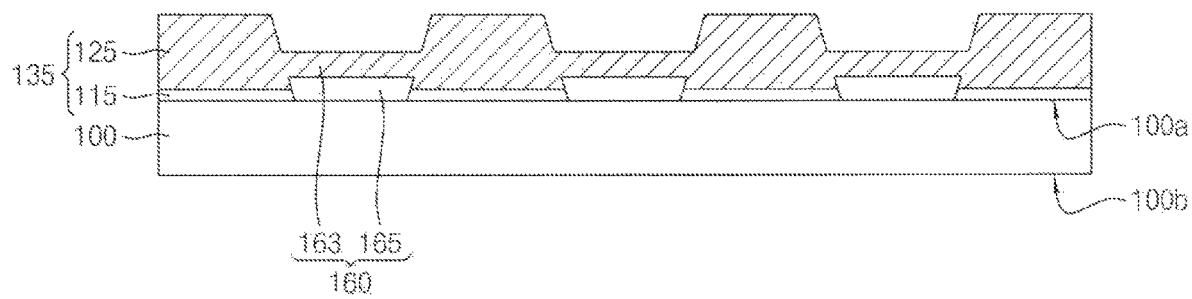

FIG. 5 is a cross-sectional view illustrating a mirror substrate in accordance with example embodiments. The mirror substrate may include first mirror patterns 135 and second mirror patterns 160 alternately and repeatedly arranged along a horizontal direction on the first surface 100a of the transparent substrate 100. The first mirror patterns 135 may include a phase compensation layer 115 and a first mirror layer 125 sequentially stacked on the first surface 100a of the transparent substrate 100. The second mirror pattern 160 may include a color control layer 165 and a second mirror layer 163 sequentially stacked on the first surface 100a of the transparent substrate 100.

In some example embodiments, the first mirror layer 125 and the second mirror layer 163 may include the same metal. For example, the first and second mirror layers 125 and 163 commonly include Ag. As illustrated in FIG. 5, the first mirror layer 125 and the second mirror layer 163 may be merged with each other as a single or unitary member.

A phase difference that may be caused due to an inclusion of different metals may be reduced because the first mirror layer 125 and the second mirror layer 163 may include the same metal. However, the color control layer 165 that is used to control a color impression at an emitting region may still contribute to the phase difference.

The phase difference may be corrected or canceled by the phase compensation layer 115 included in the first mirror pattern 135. A thickness of the phase compensation layer 115 may be determined in consideration of an extent of the phase difference caused by the color control layer 165.

In some example embodiments, if the first mirror layer 125 and the second mirror layer 163 include the same metal, a thickness of the phase compensation layer 115 may become smaller than that of the mirror substrate of FIG. 2. In some embodiments, the thickness of the phase compensation layer 115 may be smaller than a thickness of the color control layer 165. In this case, a bottom surface of the first mirror layer 125 may be lower than a bottom surface of the second mirror layer 163 from the first surface 100a of the transparent substrate 100. Thus, the first mirror layer 125 may be nearer to a viewer than the second mirror layer 163. As described above, the phase compensation layer 115 may include a transparent conductive material, for example, ITO, IZO, or the like.

Figure 6:
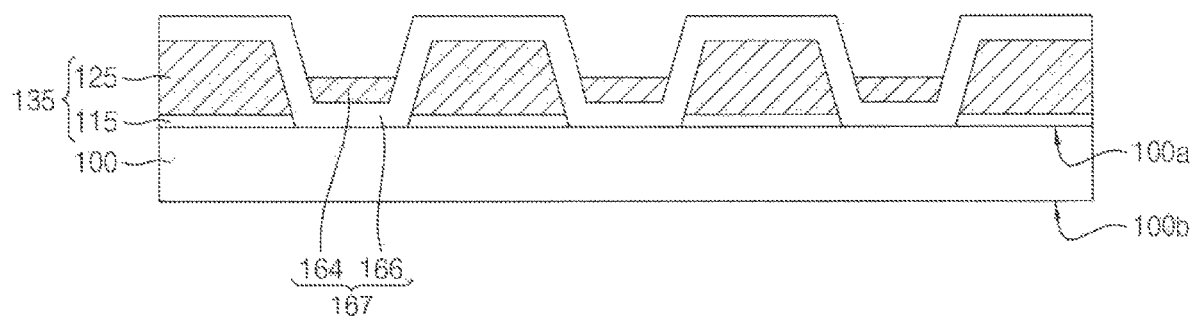

FIG. 6 is a cross-sectional view illustrating a mirror substrate in accordance with some example embodiments. The mirror substrate illustrated in FIG. 6 may have elements and/or constructions substantially the same as or similar to those illustrated in FIG. 5 except for a structure of a second mirror pattern. Thus, detailed descriptions on repeated elements and/or structure may be omitted.

Referring to FIG. 6, a color control layer 166 may extend continuously and conformally along surfaces of the first mirror patterns 135 and the first surface 100 of the transparent substrate 100. A second mirror layer 164 may be individually patterned on a portion of the color control layer 166 between the neighboring first mirror patterns 135. A second mirror pattern 167 may include the second mirror layer 164 and the portion of the color control layer 166 between the neighboring first mirror patterns 135.

In some example embodiments, the second mirror layer 164 may also have a conformal profile substantially the same as or similar to that of the color control layer 166. In this case, portions of the second mirror layer 164 and the color control layer 166 between the neighboring first mirror patterns 135 may substantially serve as a second mirror pattern. Portions of the second mirror layer 164 and the color control layer 166 formed on the first mirror pattern 135 may also serve as the first mirror pattern 135 together with the first mirror layer 125.

Figure 7:
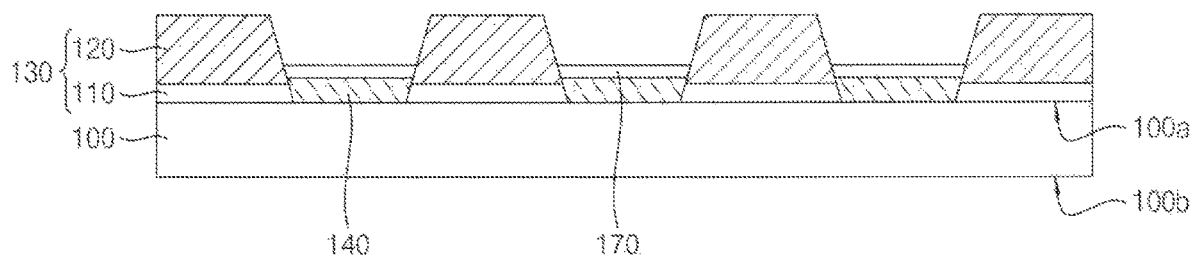

FIG. 7 is a cross-sectional view illustrating a mirror substrate in accordance with some example embodiments. The mirror substrate may include the first mirror layers 120 and second mirror layers 140 alternately and repeatedly arranged on the first surface 100a of the transparent substrate 100. The phase compensation layer 110 may be interposed between the first mirror layer 120 and the transparent substrate 100 such that the first mirror pattern 130 may include the phase compensation layer 110 and the first mirror layer 120.

In some example embodiments, a barrier layer 170 may be disposed on the second mirror layer 140. The barrier layer 170 may prevent a metallic material included in the second mirror layer 140 from being diffused to an emitting region of a display device. In some embodiments, the barrier layer 170 may include a transparent metal oxide or a transparent conductive material such as ITO or IZO. In some embodiments, the barrier layer 170 may also extend continuously on the first mirror patterns 130. The barrier layer 170 may be also applied to the mirror substrates illustrated with reference to FIGS. 1 to 6.

Figure 8:
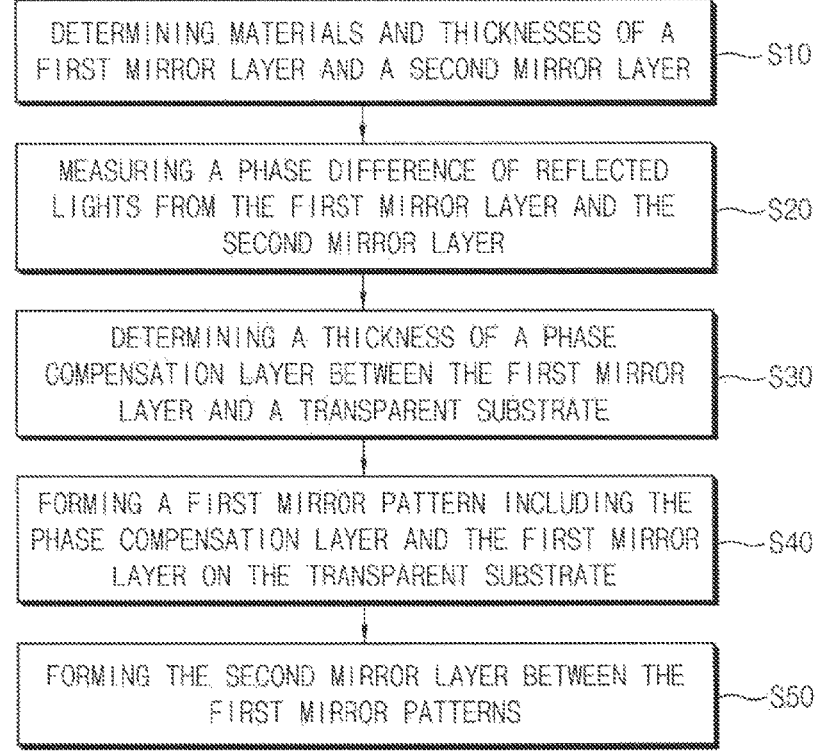
Figure 9:
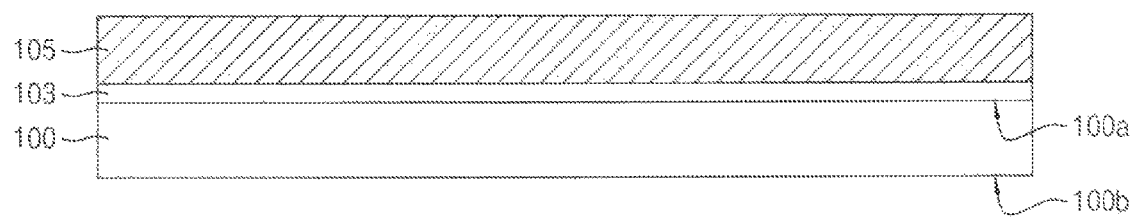
Figure 10:
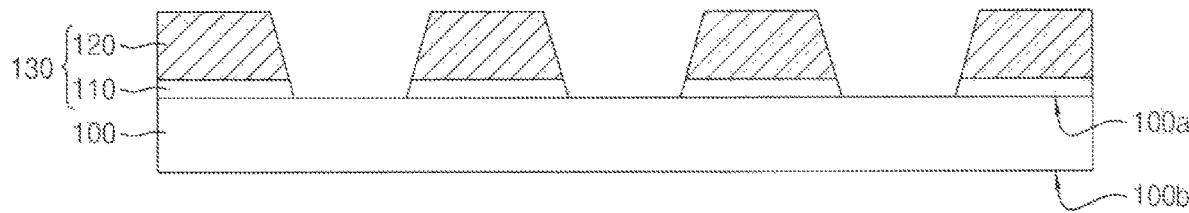
Figure 11:
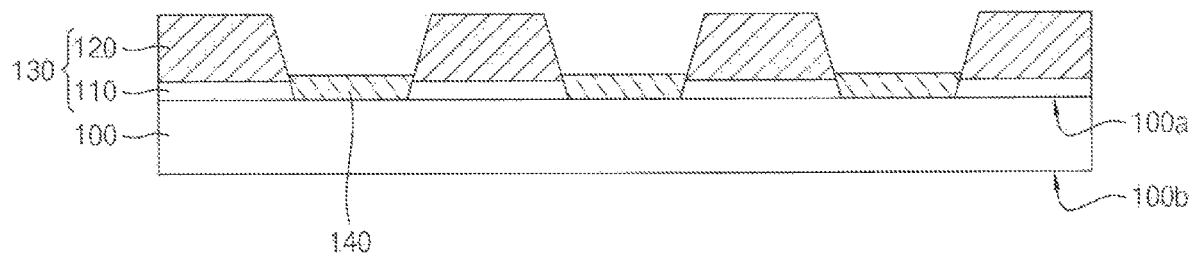

FIG. 8 is a flow chart illustrating a method of manufacturing a mirror substrate in accordance with example embodiments. FIGS. 9 to 11 are cross-sectional views illustrating a method of manufacturing a mirror substrate in accordance with example embodiments.

Referring to FIG. 8, in operation S10, materials and thicknesses of a first mirror layer and a second mirror layer may be determined. In some example embodiments, a first metal and a second metal may be determined for the first mirror layer and the second mirror layer, respectively. For example, the first metal and the second metal may be determined as Al and Ag, respectively. In some embodiments, a common metal, for example, Ag may be determined for the first mirror layer and the second mirror layer. In some example embodiments, a thickness of the first mirror layer may be determined to be greater than that of the second mirror layer.

In operation S20, a phase difference between reflected lights from the first mirror layer and the second mirror layer may be measured based on the materials and the thicknesses determined in the operation S10. In some embodiments, if the first mirror layer and the second mirror layer include Al and Ag, respectively, a penetration depth of incident light in the second mirror layer may be greater than that in the first mirror layer, and thus the phase difference of the reflected lights may be generated.

In operation S30, a thickness of a phase compensation layer that is formed between the first mirror layer and a transparent substrate may be determined based on the phase difference measured in the operation S20. In some example embodiments, the thickness of the phase compensation layer may be determined so that a phase of the reflected light from the first mirror layer may be corrected by the phase compensation layer to match a phase of the reflected light from the second mirror layer.

Referring to FIGS. 9 and 10, in operation S40, a first mirror pattern 130 including the phase compensation layer 110 having the thickness determined in the operation S30, and the first mirror layer 120 may be formed on a transparent substrate 100. In some example embodiments, as illustrated in FIG. 9, a preliminary phase compensation layer 103 and a preliminary first mirror layer 105 may be formed sequentially on the transparent substrate 100. The phase compensation layer 103 may be formed of a transparent metal oxide such as ITO or IZO. The preliminary first mirror layer 105 may be formed of a metal such as Al or Ag. In some embodiments, the preliminary phase compensation layer 103 and the preliminary first mirror layer 105 may be formed by a deposition process, for example, a sputtering process, an atomic layer deposition (ALD) process, a chemical vapor deposition (CVD) process, etc. In other embodiments, the preliminary phase compensation layer 103 and the preliminary first mirror layer 105 may be formed by an in-situ deposition process.

The preliminary phase compensation layer 103 and the preliminary first mirror layer 105 may be formed to have the materials and the thicknesses of the phase compensation layer 110 and the first mirror layer 120 as pre-determined in the operations S10 and S30.

As illustrated in FIG. 10, the preliminary first mirror layer 105 and the preliminary phase compensation layer 103 may be patterned to form a plurality of the first mirror patterns 130. The first mirror patterns 130 may be arranged on the transparent substrate 100 along the horizontal direction to be spaced apart from each other. In some example embodiments, the preliminary first mirror layer 105 and the preliminary phase compensation layer 103 may be patterned by substantially the same etching process. For example, the preliminary first mirror layer 105 and the preliminary phase compensation layer 103 may be etched concurrently by a plasma etching process.

Referring to FIGS. 8 and 11, in operation S50, the second mirror layer 140 may be formed between the neighboring first mirror patterns 130. In some example embodiments, the second mirror layer 140 may be formed of a metal by a sputtering process or an ALD process. In some embodiments, the second mirror layer 140 may be formed of Ag. The second mirror layer 140 may be formed to have the thickness determined in the operation S10, and may be thinner than the first mirror layer 120.

In some example embodiments, as illustrated in FIG. 11, the second mirror layer 140 may be individually patterned between the neighboring first mirror patterns 130. In this case, the second mirror layer 140 may be formed by a printing process using a conductive paste, or a deposition process using a slit mask. In some example embodiments, as illustrated in FIG. 3, the second mirror layer may be formed to extend continuously and conformally on surfaces of the first mirror patterns 130. Subsequently, as illustrated in FIG. 7, a barrier layer including, for example, ITO may be further formed on the second mirror layer 140.

Figure 12:
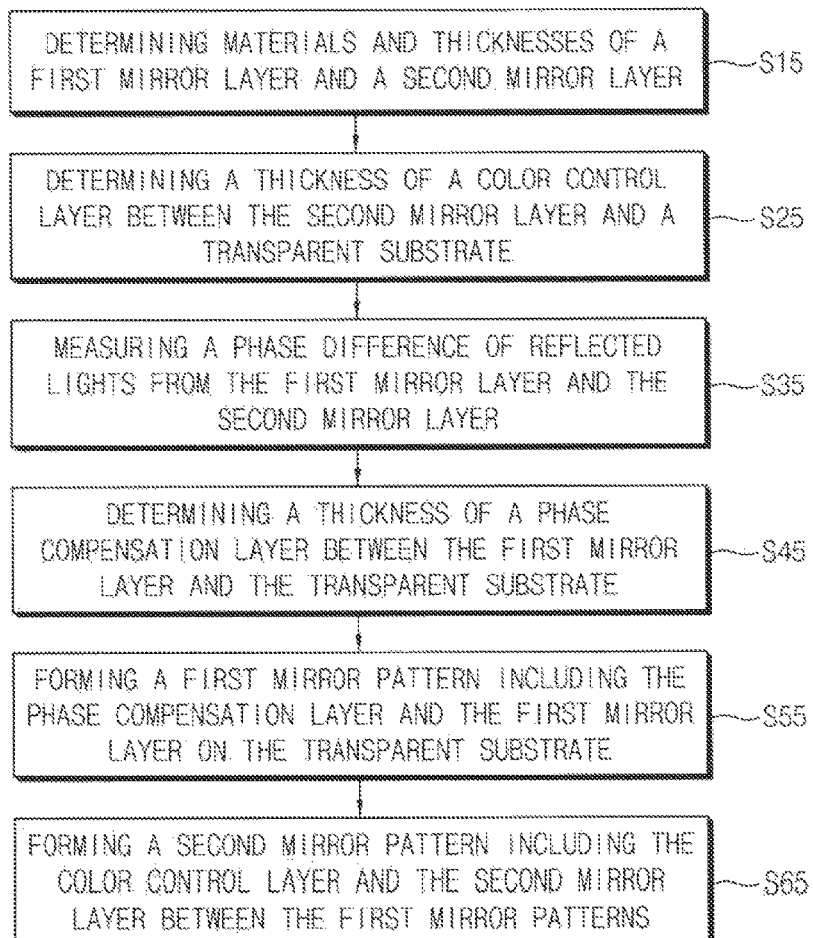
Figure 13:
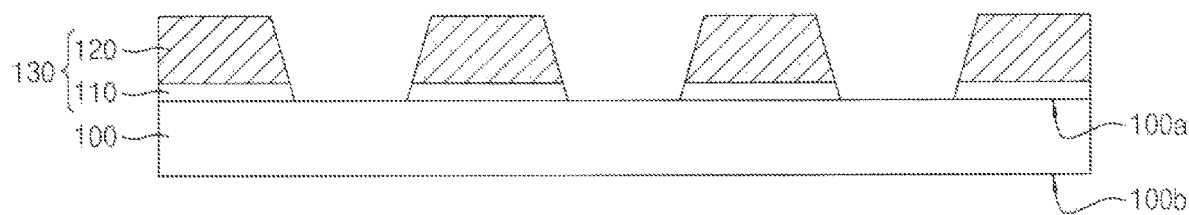
Figure 14:
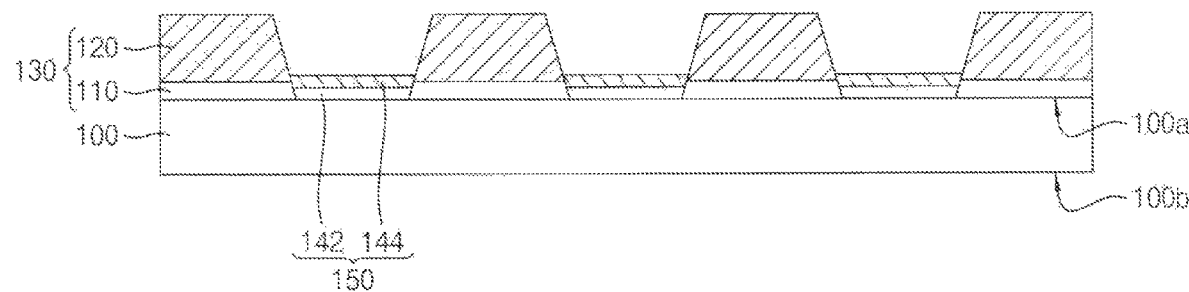

FIG. 12 is a flow chart illustrating a method of manufacturing a mirror substrate in accordance with example embodiments. FIGS. 13 and 14 are cross-sectional views illustrating a method of manufacturing a mirror substrate in accordance with example embodiments. Detailed descriptions on processes substantially the same as or similar to those described with reference to FIG. 8 and FIGS. 9 to 11 may be omitted.

Referring to FIG. 12, in operation S15, materials and thicknesses of first and second mirror layers may be determined. In some embodiments, the first mirror layer and the second mirror layer may include different metals such as Al and Ag, respectively. In some embodiments, the first and second mirror layer may be determined to include a common metal such as Ag. As described above, the thickness of the first mirror layer may be determined to be greater than the thickness of the second mirror layer.

In operation S25, a thickness of a color control layer that is formed between the second mirror layer and a transparent substrate may be determined.

In operation S35, a phase difference between reflected lights from the first mirror layer and the second mirror layer may be measured. An insertion of the color control layer under the second mirror layer may contribute to the phase difference. Accordingly, the phase difference may become greater than that measured in the operation S20 of FIG. 8

In operation S45, a thickness of a phase compensation layer that is formed between the first mirror layer and the transparent substrate may be determined based on the phase difference measured in the operation S35. For example, the thickness of the phase compensation layer may be determined to be greater than that determined in the operation S30 of FIG. 8 due to the addition of the color control layer.

In some embodiments, if the first mirror layer and the second mirror layer include Al and Ag, respectively, the thickness of the phase compensation layer may be determined to be greater than the thickness of the color control layer. In some embodiments, if the first mirror layer and the second mirror layer commonly Ag, the thickness of the phase compensation layer may be determined to be smaller than the thickness of the color control layer.

Referring FIGS. 12 and 13, in operation S55, a first mirror pattern 130 including the phase compensation layer 110 having the thickness determined in the operation S45 and the first mirror layer 120 may be formed on the transparent substrate 100. The first mirror pattern 130 may be formed by processes substantially the same as or similar to those described with reference to FIGS. 9 and 10. As described above, the phase compensation layer 110 may be formed of a transparent metal oxide such as ITO or IZO.

Referring FIGS. 12 and 14, in operation S65, a second mirror pattern 150 including the color control layer 142 and the second mirror layer 144 may be formed between the first mirror patterns 130. The second mirror layer 144 and the color control layer 142 may be formed to have the thicknesses determined in the operations S15 and S25, respectively.

In some example embodiments, the color control layer 142 may be formed of an inorganic oxide-based material such as silicon oxide or silicon oxynitride. If the second mirror layer 144 includes the same metal as that of the first mirror layer 120, the first and second mirror layers may be substantially merged with each other as illustrated in FIG. 5. In some embodiments, as illustrated in FIG. 14, the second mirror patterns 150 may be individually formed between the neighboring first mirror patterns 130 to be spaced apart from each other. In some embodiments, the color control layer and/or the second mirror layer may also extend on surfaces of the first mirror patterns 130 as illustrated in FIG. 4 or FIG. 6. Subsequently, as illustrated in FIG. 7, a barrier layer may be further formed on the second mirror layer 144.

According to some example embodiments as described above, a thickness of a phase compensation layer included in a first mirror pattern may be pre-determined in consideration of a phase matching with a reflected light from a second mirror layer or a second mirror pattern. Based on the pre-determined thickness, the first mirror layer and the phase compensation layer may be formed using materials that may be capable of being deposited and etched by the same deposition and etching processes. Therefore, a process productivity may be enhanced while improving a display quality and a reflective property of a display device and/or a mirror substrate.

Figure 15:
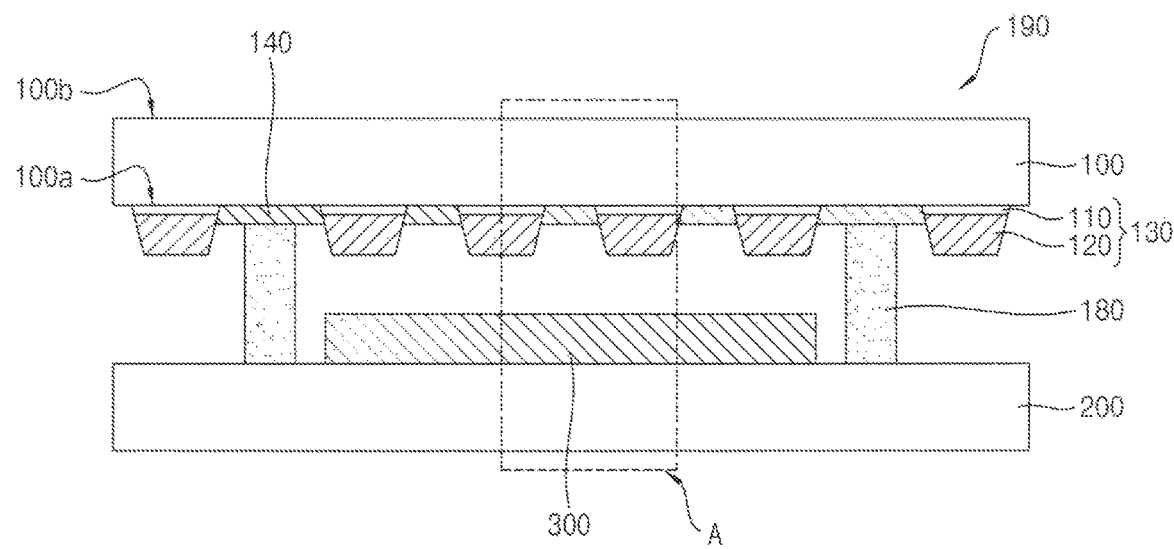
Figure 16:
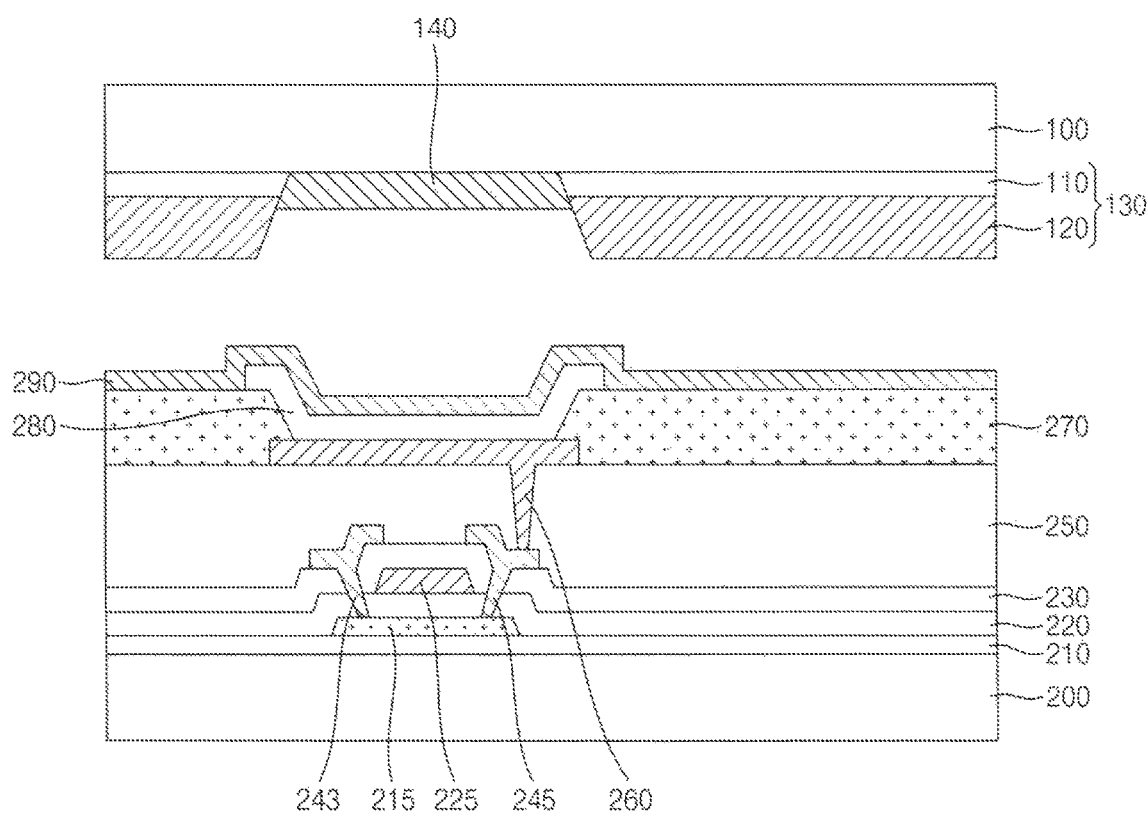
Figure 17:
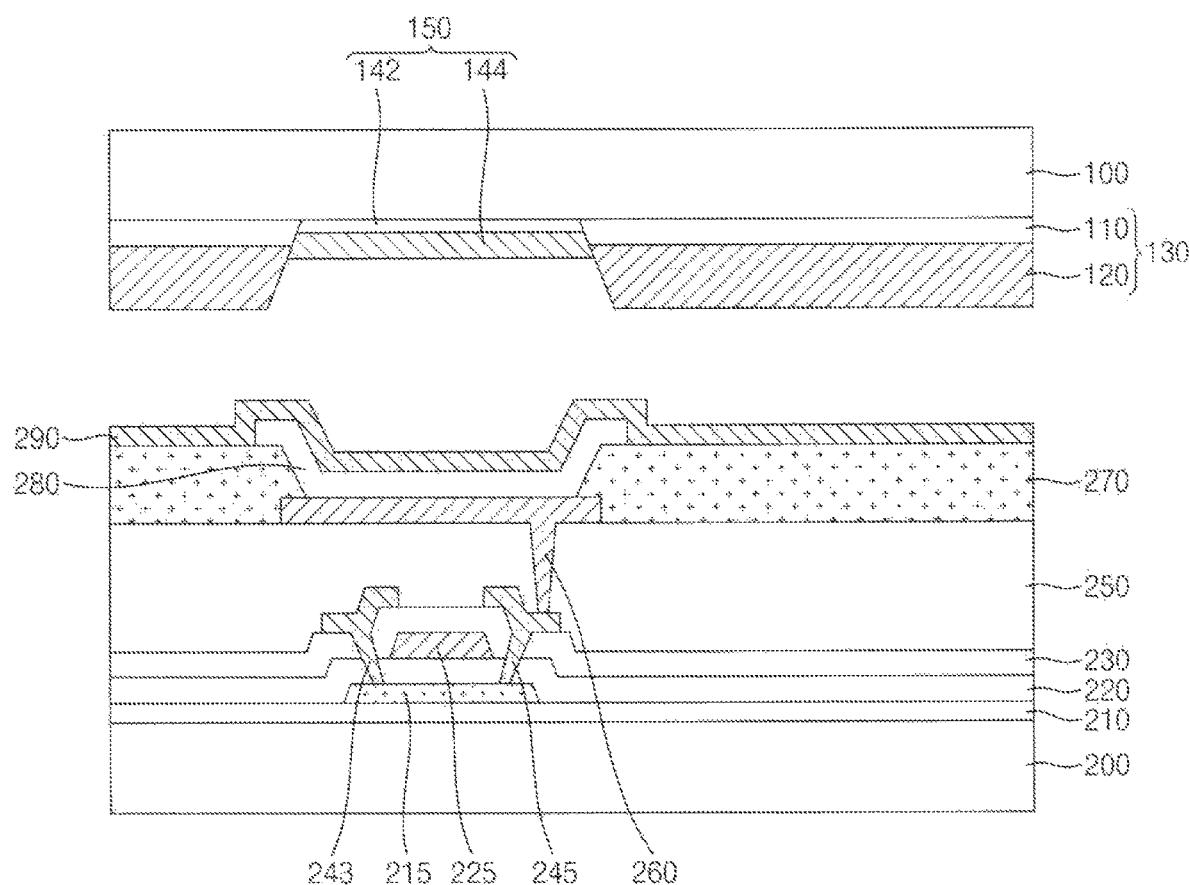
Figure 18:
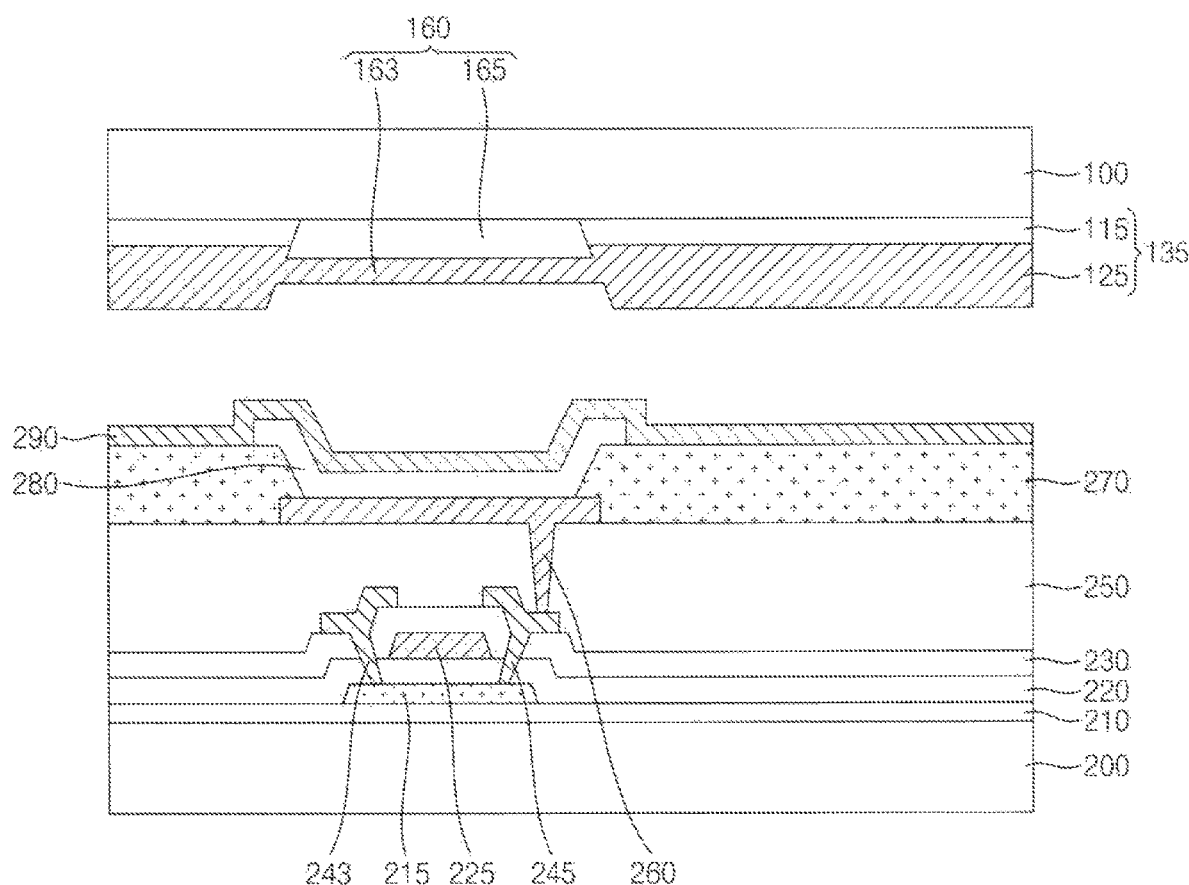

FIG. 15 is a schematic cross-sectional view illustrating a display device in accordance with example embodiments. FIGS. 16 to 18 are enlarged cross-sectional views of a portion designated as "A" of FIG. 15. Detailed descriptions on elements and/or materials substantially the same as or similar to those described with reference to FIGS. 1 to 7 may be omitted.

Referring to FIGS. 15 and 16, the display device may include a display unit 300 disposed on a display substrate 200, and a mirror substrate 190 facing the display substrate 200 with respect to the display unit 300. In some example embodiments, the mirror substrate 190 may have structures and/or constructions substantially the same as or similar to those illustrated with reference to FIG. 1. As described above, the mirror substrate 190 may include a first mirror pattern 130 and a second mirror layer 140 alternately and repeatedly arranged on a first surface 100a of a transparent substrate 100. The first mirror pattern 130 may include a phase compensation layer 110 and a first mirror layer 120 sequentially stacked from the first surface 100a.

A sealing member 180 may be interposed between the transparent substrate 100 and the display substrate 200 such that the display unit 300 may be encapsulated. Thus, the mirror substrate 190 may substantially serve as an encapsulation substrate.

In some embodiments, the sealing member 180 may be in contact with the second mirror layer 140 at a peripheral region of the mirror substrate 190. In this case, the first mirror pattern 130 at the peripheral region may serve as an align key. In other embodiments, the sealing member 180 may be in contact with the first mirror pattern 130 or the first surface 100a.

As illustrated in FIG. 16, the display unit 300 may include a switching device on the display substrate 200, and a display structure electrically connected to the switching device. The display unit 300 may further include a wiring structure such as a scan line, a data line, a power line, etc. that may be electrically connected to the switching device and/or the display structure. An insulation structure covering the switching device and/or the wiring structure may be also included in the display unit 300. The insulation structure may include, for example, a barrier layer 210, an insulating interlayer 230, and a via insulation layer 250.

The switching device may include a thin film transistor (TFT) including an active pattern 215, a gate insulation layer 220, a gate electrode 225, a source electrode 243 and a drain electrode 245. The display structure may include a first electrode 260, a display 280, and the second electrode 290. The display substrate 200 may include a glass substrate, a transparent plastic substrate or a flexible plastic substrate.

The barrier layer 210 may be formed on an upper surface of the display substrate 200. Moisture penetrating through the display substrate 200 may be blocked by the barrier layer 210, and impurity diffusion between the display substrate 200 and structures thereon may be also blocked by the barrier layer 210.

For example, the barrier layer 210 may include silicon oxide, silicon nitride, or silicon oxynitride. These may be used alone or in a combination thereof. In an embodiment, the barrier layer 210 may have a multi-layered structure including a silicon oxide layer and a silicon nitride layer.

The active pattern 215 may include a silicon-based semiconductor compound such as polysilicon. In some embodiments, the active pattern 215 may include an oxide semiconductor such as indium gallium zinc oxide (IGZO), zinc tin oxide (ZTO), or indium tin zinc oxide (ITZO). For example, the active layer 215 including the silicon compound or the oxide semiconductor may be formed by a sputtering process, and then may be patterned by a photo-lithography process.

The gate insulation layer 220 may be formed on the barrier layer 210, and cover the active pattern 215. The gate insulation layer 220 may include silicon oxide, silicon nitride, and/or silicon oxynitride. The gate insulation layer 220 may have a multi-layered structure including a silicon oxide layer and a silicon nitride layer.

The gate electrode 225 may be formed on the gate insulation layer 220, and may be superimposed over the active pattern 215. For example, a first conductive layer may be formed on the gate insulation layer 220, and may be patterned by a photo-lithography process to form the gate electrode 225. The first conductive layer may be formed of a metal such as Al, Ag, W, Cu, Mo, Ti, Ta, Cr, etc., or a nitride thereof by a sputtering process or an ALD process. The first conductive layer may be formed as a multi-layered structure such as an Al/Mo structure or a Ti/Cu structure. In some embodiments, the scan line may be also formed from the first conductive layer. The gate electrode 225 may diverge from the scan line.

In some embodiments, an ion-implantation process may be performed using the gate electrode 225 as an implantation mask to form a source region and a drain region at both ends of the active pattern 215. A portion of the active pattern 215 between the source and drain regions that may overlap the gate electrode 225 may be defined as a channel region through which a charge may be moved or transferred.

The insulating interlayer 230 may be formed on the gate insulation layer 220, and may cover the gate electrode 225. The insulating interlayer 230 may include silicon oxide, silicon nitride, and/or silicon oxynitride. The insulating interlayer 230 may have a multi-layered structure including a silicon oxide layer and a silicon nitride layer.

The source electrode 243 and the drain electrode 245 may extend through the insulating interlayer 230 and the gate insulation layer 220 to contact with the active pattern 215. The source electrode 243 and the drain electrode 245 may be in contact with the source region and the drain region, respectively, of the active pattern 215.

For example, the insulating interlayer 230 and the gate insulation layer 220 may be partially etched to form contact holes through which the active pattern 215 may be exposed. A second conductive layer filling the contact holes may be formed on the insulating interlayer 230, and may be patterned by a photo-lithography process to form the source electrode 243 and the drain electrode 245. The second conductive layer may be formed from a material and a process substantially the same as or similar to those to form the first conductive layer.

In some embodiments, a data line may be also formed from the second conductive layer. In this case, the source electrode 243 may diverge from the data line.

The TFT may be formed in each pixel of the display unit by the processes as described above. In some embodiments, at least two TFTs and a capacitor may be formed in each pixel.

The via insulation layer 250 may be formed on the insulating interlayer 230, and may cover the source and drain electrodes 243 and 245. The via insulation layer 250 may be formed using an organic material such as polyimide, an epoxy resin, an acrylate-based resin, or polyester by a spin coating process or a slit coating process. The via insulation layer 250 may also serve as a planarization layer of the display unit 300.

The display structure may be formed on the via insulation layer 250. The first electrode 260 may extend through the via insulation layer 250, and may be electrically connected to the drain electrode 245. For example, the via insulation layer 250 may be partially etched to form a via hole through which the drain electrode 245 may be exposed. A third conductive layer sufficiently filling the via hole may be formed on the via insulation layer 250, and may be patterned by a photolithography process to form the first electrode 260. The first electrode 260 may serve as an anode or a pixel electrode of the display unit 300, and may be formed per each pixel included in the display unit 300.

The third conductive layer may be formed from a material and a process substantially the same as or similar to those to form the first conductive layer. In some embodiments, the third conductive layer may be formed of a transparent conductive layer such as indium tin oxide (ITO), indium zinc oxide (IZO), zinc oxide, indium oxide, etc.

A pixel defining layer (PDL) 270 may be formed on the via insulation layer 250 to cover a peripheral portion of the first electrode 260. For example, the PDL 270 may be formed using a photosensitive organic material by exposure and developing processes. Alternatively, the PDL 270 may be formed of a silicon-based inorganic material by a photolithography process. In some example embodiments, an area of the first electrode 260 exposed by the PDL 270 may substantially correspond to an emitting region of each pixel.

The display layer 280 may be formed on the first electrode 260 and the PDL 270. In some example embodiments, the display layer 280 may include an organic light emitting material, and the display device may be provided as an OLED device. In this case, a hole transport layer (HTL) and an electron transport layer (ETL) may be further formed under the display layer 280 and on the display layer 280, respectively. For example, the display layer 280 may be formed by individually printing the organic light emitting material at each pixel through a fine metal mask (FMM). The HTL and the ETL may be formed at each pixel, or may be formed commonly at a plurality of the pixels.

In some embodiments, a liquid crystal material may be used for the display layer 280. In this case, the display device may be provided as an LCD device.

The second electrode 290 may be formed on the PDL 270 and the display layer 280. In some embodiments, the second electrode 290 may serve as a common electrode formed on the plurality of the pixels. The second electrode 290 may also serve as a cathode of the display unit 300. In some embodiments, the second electrode 290 may be formed commonly on the emitting region and a non-emitting region of the display unit 300. The second electrode 290 may be formed by a depositing a metal or a transparent conductive material as mentioned above through, for example, an open mask.

The display unit 300 may be formed on the display substrate 200, and the mirror substrate 190 may be formed on the display substrate 200 using the sealing member 180 such that the mirror substrate 190 and the display substrate 200 may face each other. As illustrated in FIG. 16, the second mirror layer 140 of the mirror substrate 190 may substantially overlap the emitting region of the display unit 300. The second mirror layer 140 having a relatively small thickness may face the emitting region so that a display property may be substantially realized.

In some embodiments, the barrier layer 170 as illustrated in FIG. 7 may be further formed on the second mirror layer 140. For example, the barrier layer 170 blocks a metallic material included in the second mirror layer 140 from being diffused to the display unit 300. The non-emitting region of the display unit 300 may substantially overlap the first mirror pattern 130 of the mirror substrate 190. In some embodiments, the first mirror pattern 130 may substantially overlap the PDL 270.

A mirror property may be realized on the non-emitting region by the first mirror layer 120 that may have relatively large refractive index, reflectivity and thickness. Additionally, the phase compensation layer 110 may correct a phase difference from a reflected light at the second mirror layer 140 to achieve an improved reflective property. In some embodiments, as illustrated in FIG. 3, the second mirror layer may be also formed conformally on surfaces of the first mirror patterns 130.

Referring to FIG. 17, a color control layer 142 may be included in a portion of the mirror substrate overlapping the emitting region. Accordingly, the color control layer 142 may adjust a color impression of light generated from the emitting region. A second mirror pattern 150 may include the color control layer 142 and a second mirror layer 144, and may overlap the emitting region.

A thickness of the phase compensation layer 110 of the first mirror pattern 130 may be further increased in consideration of a phase difference contributed by the color control layer 142. In some example embodiments, if the first mirror layer 120 and the second mirror layer 144 include Al and Ag, respectively, the thickness of the phase compensation layer 110 may be greater than that of the color control layer 142. Thus, the second mirror layer 144 may be nearer to a viewer than the first mirror layer 120. In some embodiments, as illustrated in FIG. 4, the color control layer and the second mirror layer may be also formed conformally on surfaces of the first mirror patterns 130.

Referring to FIG. 18, the first mirror layer 125 and the second mirror layer 163 may commonly include a metal, for example, Ag. In this case, the first and second mirror layers 125 and 163 may be merged with each other. The phase compensation layer 115 and the color control layer 165 may be included in the first mirror pattern 135 and the second mirror pattern 160, respectively, and the phase compensation layer 115 may be thinner than the color control layer 165. Accordingly, the first mirror layer 125 may be nearer to a viewer than the second mirror layer 163. In some embodiments, as illustrated in FIG. 6, the color control layer 165 may be also formed conformally along surfaces of the first mirror patterns 130. The second mirror layer may be also formed conformally along the surfaces of the first mirror patterns 130 on the color control layer 165.

Hereinafter, properties of the mirror substrate according to some example embodiments are described in more detail with reference to Experimental Examples.

EXPERIMENTAL EXAMPLE 1

A first mirror layer having a thickness of 1,000 Å and including Al was formed on a first region (i.e., a first mirror region) of a glass substrate. A second mirror layer having a thickness of 1,000 Å and including Ag, and a barrier layer having a thickness of 150 Å and including ITO were formed on a second region (i.e., a second mirror region) of the glass substrate.

A visible light having a wavelength of 530 nm was introduced to the first mirror layer and the second mirror layer, and phases of the reflected lights therefrom were measured. For example, the phases of the reflected lights from the first mirror layer and the second mirror layer were −135° and −113°, respectively, and thus a phase difference was about 22°.

Subsequently, a phase compensation layer including ITO was formed between the glass substrate and the first mirror layer to correct the phase difference. A phase of a reflected light from the first mirror layer became consistent with that from the second mirror layer by forming the phase compensation layer having a thickness of 127 Å.

EXPERIMENTAL EXAMPLE 2

A first mirror layer having a thickness of 1,000 Å and including Al was formed on a first region of a glass substrate. A color control layer having a thickness of 300 Å and including silicon oxide ($SiO_2$), a second mirror layer having a thickness of 250 Å and including Ag, and a barrier layer having a thickness of 150 Å and including ITO were sequentially formed on a second region of the glass substrate.

A phase difference of reflected lights from the first mirror layer and the second mirror layer was measured in the same method as that in Experimental Example 1, and the phase difference was about 95°.

Subsequently, a phase compensation layer including ITO was formed between the glass substrate and the first mirror layer to correct the phase difference. A phase of a reflected light from the first mirror layer became consistent with that from the second mirror layer by forming the phase compensation layer having a thickness of 386 Å.

EXPERIMENTAL EXAMPLE 3

A first mirror layer having a thickness of 1,000 Å and including Ag was formed on a first region of a glass substrate. A color control layer having a thickness of 300 Å and including silicon oxide, a second mirror layer having a thickness of 150 Å and including Ag, and a barrier layer having a thickness of 150 Å and including ITO were sequentially formed on a second region of the glass substrate.

A phase difference of reflected lights from the first mirror layer and the second mirror layer was measured in the same method as that in Experimental Example 1, and the phase difference was about 80°.

Subsequently, a phase compensation layer including ITO was formed between the glass substrate and the first mirror layer to correct the phase difference. A phase of a reflected light from the first mirror layer became consistent with that from the second mirror layer by forming the phase compensation layer having a thickness of 285 Å.

According to some example embodiments of the present disclosure, in a mirror substrate including first and second mirror layers of different thicknesses, a phase compensation layer may be inserted so that phases of reflected lights from the first and second mirror layers may become consistent with each other. Thus, a reflective property from the mirror substrate may be improved. A thickness of the phase compensation layer may be finely adjusted in consideration of materials of the first and second mirror layers, and an addition of a color control layer, and thus a display quality and a reflective property of a display device including the mirror substrate may be optimized.

The foregoing is illustrative of example embodiments and is not to be construed as limiting thereof. Although some example embodiments have been described, those skilled in the art will readily appreciate that many modifications and deviations are possible in the example embodiments without materially departing from the novel teachings and advantages of the present disclosure. Accordingly, such modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present disclosure.

What is claimed is:

1. A substrate, comprising:
    a transparent substrate;
    a plurality of first reflection patterns arranged on the transparent substrate and spaced apart from each other, each of the first reflection patterns including a phase compensation layer and a first reflection layer sequentially stacked on the transparent substrate; and
    a second reflection layer disposed on the transparent substrate and between neighboring ones of the first reflection patterns, the second reflection layer having a second thickness less than a first thickness of the first reflection layer.

2. The substrate of claim 1, wherein the phase compensation layer includes a transparent metal oxide.

3. The substrate of claim 2, wherein the phase compensation layer includes at least one of indium tin oxide (ITO), indium zinc oxide (IZO), zinc oxide or indium oxide.

4. The substrate of claim 2, further comprising a color control layer interposed between the second reflection layer and the transparent substrate.

5. The substrate of claim 4, wherein the color control layer includes silicon oxide.

6. The substrate of claim 4, wherein the first reflection layer includes aluminum (Al), and the second reflection layer includes silver (Ag).

7. The substrate of claim 6, wherein a thickness of the phase compensation layer is greater than a thickness of the color control layer, and
    the first reflection layer is farther from a surface of the transparent substrate than the second reflection layer.

8. The substrate of claim 4, wherein the first reflection layer and the second reflection layer commonly include Ag.

9. The substrate of claim 8, wherein a thickness of the phase compensation layer is less than a thickness of the color control layer, and
    the second reflection layer is farther from a surface of the transparent substrate than the first reflection layer.

10. The substrate of claim 4, wherein the color control layer extends continuously along surfaces of the first reflection patterns and the transparent substrate.

11. The substrate of claim 1, wherein the second reflection layer extends continuously along surfaces of the first reflection patterns and the transparent substrate, and a second reflection pattern includes a portion of the second reflection layer formed between the neighboring ones of the first reflection patterns.

12. The substrate of claim 1, further comprising a barrier layer including a transparent conductive material, the barrier layer being disposed on the second reflection layer.

13. A method of manufacturing a substrate, comprising:
    determining a first thickness and a first material of a first reflection layer and a second thickness and a second material of a second reflection layer;
    measuring a phase difference of reflected lights from the first reflection layer and the second reflection layer;
    determining a thickness of a phase compensation layer based on the measured phase difference;

forming first reflection patterns on a transparent substrate, each first reflection pattern including the phase compensation layer having the determined thickness and the first reflection layer made of the first material having the first thickness; and forming the second reflection layer made of the second material having the second thickness on the transparent substrate and between neighboring ones of the first reflection patterns.

14. The method of claim 13, wherein the first thickness of the first reflection layer is greater than the second thickness of the second reflection layer.

15. The method of claim 13, further comprising determining a thickness of a color control layer between the second reflection layer and the transparent substrate, and wherein the thickness of the phase compensation layer is determined in consideration of a change of the phase difference due to the color control layer.

16. The method of claim 15, further comprising, before forming the second reflection layer, forming the color control layer on the transparent substrate and between the neighboring ones of the first reflection patterns, wherein a second reflection pattern includes the color control layer and the second reflection layer.

17. A display device, comprising:
a display substrate;
a display unit on the display substrate; and
a substrate facing the display substrate with respect to the display unit, the substrate including:
a transparent substrate;
a plurality of first reflection patterns arranged on the transparent substrate and spaced apart from each other, each of the first reflection patterns including a phase compensation layer and a first reflection layer sequentially stacked on the transparent substrate; and
a second reflection layer disposed on the transparent substrate and between neighboring ones of the first reflection patterns, the second reflection layer having a second thickness less than a first thickness of the first reflection layer.

18. The display device of claim 17, wherein the display unit includes an emitting region including a pixel electrode and an emitting layer, and a non-emitting region, wherein the non-emitting region overlaps the first reflection patterns, and the emitting region overlaps the second reflection layer.

19. The display device of claim 18, wherein the substrate further includes a color control layer interposed between the transparent substrate and the second reflection layer.

20. The display device of claim 19, wherein the first reflection layer includes aluminum (Al) or silver (Ag), the second reflection layer includes Ag, the color control layer includes silicon oxide, and the phase compensation layer includes a transparent metal oxide.

* * * * *